(12) United States Patent
Remsburg (10) Patent No.: US 10,518,353 B2
(45) Date of Patent: Dec. 31, 2019

(54) BONDED FUNCTIONALLY GRADED MATERIAL STRUCTURE FOR HEAT TRANSFER AND CTE MATCHING AND METHOD OF MAKING SAME

(71) Applicant: COOLER MASTER CO., LTD., New Taipei (TW)

(72) Inventor: Ralph Remsburg, Midland, TX (US)

(73) Assignee: Ralph Remsburg, Midland, TX (US)

( * ) Notice: Subject to any disclaimer, the term of this patent is extended or adjusted under 35 U.S.C. 154(b) by 0 days.

(21) Appl. No.: 16/163,224

(22) Filed: Oct. 17, 2018

(65) Prior Publication Data

US 2019/0047082 A1   Feb. 14, 2019

Related U.S. Application Data

(62) Division of application No. 14/984,580, filed on Dec. 30, 2015, now Pat. No. 10,183,358.

(Continued)

(51) Int. Cl.
*H01L 21/02* (2006.01)
*H01L 23/373* (2006.01)
(Continued)

(52) U.S. Cl.
CPC ........ *B23K 20/2333* (2013.01); *B23K 20/002* (2013.01); *B23K 20/021* (2013.01); *B23K 20/023* (2013.01); *B23K 20/24* (2013.01); *B23K 26/355* (2018.08); *B23K 35/0255* (2013.01); *B23K 35/286* (2013.01); *B23K 35/302* (2013.01); *B32B 3/266* (2013.01); *B32B 15/01* (2013.01); *B32B 15/017* (2013.01); *C22C 9/00* (2013.01); *H01L 21/022* (2013.01);
(Continued)

(58) Field of Classification Search
None
See application file for complete search history.

(56) References Cited

U.S. PATENT DOCUMENTS 4,015,099 A   3/1977   Seniuk et al.
4,030,967 A   6/1977   Ingrey et al.
(Continued)

OTHER PUBLICATIONS

Notice of Allowance issued in related U.S. Appl. No. 14/984,580 dated Oct. 13, 2018.
(Continued)

*Primary Examiner* — Stephanie P Duclair
(74) *Attorney, Agent, or Firm* — McDermott Will & Emery LLP (57) ABSTRACT

A method for producing a bonded functionally graded Material (FGM) structure, includes the steps of providing a plurality of dissimilar material layers; forming a first group and a second group of through holes alternately on a plurality of intermediate dissimilar material layers and on a bottom dissimilar material layer, wherein the first group of through holes has a diameter larger than a diameter of the second group of through holes; stacking the plurality of dissimilar material layers on top of one another. A first group of through holes on any dissimilar material layer is arranged corresponding to a second group of through holes on a dissimilar material layer stacked above, and a second group of through holes on any dissimilar material layer is arranged corresponding to a first group of through holes on a dissimilar material stacked right below; and bonding the plurality of dissimilar material layers.

4 Claims, 5 Drawing Sheets

Related U.S. Application Data (60) Provisional application No. 62/097,605, filed on Dec. 30, 2014, provisional application No. 62/099,125, filed on Dec. 31, 2014, provisional application No. 62/097,030, filed on Dec. 27, 2014.

(51) Int. Cl.

| | | |
|---|---|---|
| *H01L 21/311* | (2006.01) | |
| *H01L 21/3065* | (2006.01) | |
| *C22C 9/00* | (2006.01) | |
| *B32B 3/26* | (2006.01) | |
| *B32B 15/01* | (2006.01) | |
| *B23K 35/30* | (2006.01) | |
| *B23K 35/28* | (2006.01) | |
| *B23K 35/02* | (2006.01) | |
| *B23K 26/382* | (2014.01) | |
| *B23K 26/361* | (2014.01) | |
| *B23K 26/352* | (2014.01) | |
| *B23K 20/24* | (2006.01) | |
| *B23K 20/233* | (2006.01) | |
| *B23K 20/02* | (2006.01) | |
| *B23K 20/00* | (2006.01) | |
| *B23K 103/10* | (2006.01) | |
| *B23K 103/12* | (2006.01) | |
| *B23K 103/18* | (2006.01) | |

(52) U.S. Cl.
CPC .. *H01L 21/30655* (2013.01); *H01L 21/31111* (2013.01); *H01L 21/31133* (2013.01); *B23K 2103/10* (2018.08); *B23K 2103/12* (2018.08); *B23K 2103/18* (2018.08); *H01L 21/02658* (2013.01); *H01L 23/3735* (2013.01)

(56) References Cited

U.S. PATENT DOCUMENTS

| | | |
|---|---|---|
| 4,283,464 A | 8/1981 | Hascoe |
| 4,577,678 A | 3/1986 | Frauenfeld et al. |
| 5,358,795 A | 10/1994 | Nakamura et al. |
| 5,561,321 A | 10/1996 | Hirano et al. |
| 5,599,468 A | 2/1997 | Mako et al. |
| 5,981,085 A | 11/1999 | Ninomiya et al. |
| 5,985,464 A | 11/1999 | Schmitt et al. |
| 6,046,907 A | 4/2000 | Yamaguchi |
| 6,129,993 A | 10/2000 | Kumamoto et al. |
| 6,180,259 B1 | 1/2001 | Harada et al. |
| 6,375,877 B2 | 4/2002 | Lauf et al. |
| 6,416,846 B2 | 7/2002 | Long |
| 6,443,352 B1 | 9/2002 | White |
| 6,519,500 B1 | 2/2003 | White |
| 6,897,123 B2 | 5/2005 | Winther |
| 6,992,261 B2 | 1/2006 | Kachalov et al. |
| 7,951,467 B2 | 5/2011 | Tsushima |
| 2002/0043364 A1 | 4/2002 | Suzuki et al. |
| 2012/0276403 A1 | 11/2012 | Nakagawa et al. |
| 2014/0017512 A1 | 1/2014 | Iimori et al. |

OTHER PUBLICATIONS

Shirzadi, A.A. "Diffusion Bonding Aluminum Alloys and Composites: New Approaches and Modelling," Ph.D. Thesis, King's College, University of Cambridge (Dec. 1997).

Truog, A.G., "Bond Improvements of Al/Cu Joints Created by Very High Power Ultrasonic Additive Manufacturing," Master's Thesis, Ohio State University.

BONDED FUNCTIONALLY GRADED MATERIAL STRUCTURE FOR HEAT TRANSFER AND CTE MATCHING AND METHOD OF MAKING SAME

CROSS REFERENCE TO RELATED APPLICATIONS

This application is the Divisional Application of U.S. application Ser. No. 14/984,580 filed Dec. 30, 2015, now allowed, which claims the benefit of U.S. provisional patent application Ser. No. 62/097,030 filed on Dec. 27, 2014, 62/097,605 filed Dec. 30, 2014, and 62/099,125 filed on Dec. 31, 2014, the entire contents of which are hereby incorporated by references.

FIELD OF THE INVENTION

The present invention relates to bonding dissimilar material, in particular to a method for bonding an aluminum or aluminum alloy to a copper or copper alloy.

BACKGROUND OF THE INVENTION

There are many applications for highly integrally bonded dissimilar metals. In particular, bonding aluminum to dissimilar metals, particularly copper, is useful in applications requiring high thermal or electrical conductivity, and has been the subject of searches and studies in the industry. However, although copper is an excellent heat and electrical conductor, copper has a high CTE, (coefficient of thermal expansion) that does not match the CTE, for semiconductor materials.

In the industry, in order to bond a copper heat sink to a DBC (direct bond copper substrate), a thick layer of solder is generally used. Solder, having some plasticity, is employed to absorb the CTE mismatch between copper and a DBC. Although a thick solder layer has proven useful, the high thermal resistance of such a layer presents problems for high power electronic components, and solder may develop cracks with repeated temperature cycles.

U.S. Pat. No. 6,897,123 to Winther (2005) is a representative of a number of prior art patents, which provide methods to bond dissimilar materials having different CTEs. Winther teaches the use of a functionally graded interlayer, which provides a different CTE on each mating face. The material is made using a resin and filler particles. The prior art does not deal effectively with the bonding of dissimilar metals, or the bonding of materials with poor thermal conductivity, such as resins.

Aluminum is a metal that is very difficult to bond to other materials or to itself. Aluminum is highly reactive to oxygen, nitrogen and argon. The aluminum base metal forms a tenacious non-permeable oxide layer upon contact with the atmosphere. This oxide layer protects the base metal from further oxidation. The oxide layer can grow to 5.0 nm in a natural environment, and in a hot environment (300° C.) the oxide layer can grow to 30 nm thick. If the oxide layer is removed, it will immediately reform. The oxide layer is a good dielectric layer and has poor thermal conductivity, and thus prevents another material from bonding with the aluminum base metal. In any application that requires bonding aluminum and copper, the aluminum surface must be free of all oxide particles.

In general there are three methods used to remove aluminum oxide: mechanical, chemical, and plasma. There are also combinations of these three methods. The mechanical method usually involves drawing a stainless steel wire brush rapidly across the bonding surface or machining the surface. Chemical methods to remove aluminum include using acid (nitric acid, $HNO_3$) solutions or alkaline (sodium hydroxide, NaOH) solutions. U.S. Provisional Patent Application No. 62/097,030 teaches the use of an acid consisting of 80% phosphoric acid ($H_3PO_4$)+5% acetic acid ($CH_3COOH$)+5% nitric acid ($HNO_3$)+10% water ($H_2O$). Plasma cleaning processes have also been used to successfully remove aluminum oxide. If the aluminum part is attached to a negative pole, a stream of positive ions will bombard the surface, and break up the aluminum oxide layer. The dislodged particles can be removed by a plasma arc. U.S. Pat. No. 4,030,967 to Ingrey, Nentwich, and Poulsen (1977) describes a plasma etching process that removes aluminum oxide using gaseous trihalide in a radical-flow type reactor. However, after the aluminum oxide layer is removed, the aluminum component must be processed quickly because a new oxide layer immediately begins to form as soon as the cleaning process ends.

There are many solid state methods known to bond aluminum to aluminum or to a dissimilar metal. In roll bonding, the surfaces of the materials are cleaned and then immediately passed through a rolling mill. The large plastic deformation causes the oxide layer to fracture and materials are able to bond with the aluminum base metal by heat and pressure. In the diffusion bonding method, the surfaces of the materials are cleaned and then pressed together using a mechanical force or by an isostatic pressure. The variables deciding whether there is a successful bond are the degree of the elimination of the oxide layer, temperature, pressure, and time. In the ultrasonic bonding method, ultrasonic energy and pressure induce an oscillating shear force that fractures the oxide layer and then produces a metallurgical bond. In the explosive welding method, the materials are placed at an angle and a detonator causes one plate to impact the other plate. The force of the impact removes a thin layer from the material surfaces and the high pressure causes the materials to bond. Bond quality is dependent on collision angle, impact velocity, material properties, and geometry. The friction welding method uses a rotary or linear motion of two materials against each other. An advantage of friction welding, like explosion welding, is that the welding process itself removes the oxide layer.

There are many types of material that can be bonded. However, achieving a successful bond of aluminum and copper is difficult. The materials react and form intermetallics above 120° C. Intermetallic $Al_2Cu$ forms first, followed by $Al_4Cu_9$, and then AlCu. In the present application, the diffusion bonding of aluminum alloys and copper alloys is described.

There are two basic types of diffusion bonding. One is to use a mechanical force to apply pressure to bond the components, and the other is to use a pressure chamber to apply isostatic pressure. The method of applying a high pressure gas force is known as Hot Isostatic Pressing (HIP). Both methods can be used to stack components so that multiple components can be bonded in a single batch process.

Within the domain of diffusion bonding there are subsets of the two basic processes. Shirzadi (1997) presents an analysis of six Transient Liquid Phase methods for diffusion bonding AlSiC to AlSiC (Aluminum Silicon Carbide). However, Transient Liquid Phase methods are costly and not well suited for high volume production.

A few patents teach methods of interlocking aluminum and copper to form a stronger bonded material that provides better thermal and electrical conductivity. U.S. Pat. No. 4,015,099 to Seniuk and Gagnon (1977) discloses a method to silver coat a threaded copper button, and after threading into an aluminum piece, preheating the assembly to between 190° C. and 245° C., and then arc welding using aluminum filler under an inert gas shield. U.S. patent application 2014/0017512 to Iimori and Hopper (2014) teaches the use of a copper-plated aluminum button which passes through a cloth member, and plastically deforms to interlock with a concave mating flange. U.S. provisional patent application 62/097,605 to Remsburg (2014) teaches a single interlocking layer between closely matched materials.

However, the above disclosures all fail to provide an effective interlock mechanism to increase the strength, electrical conductivity, thermal conductivity, and CTE matching of the stacked dissimilar metals.

SUMMARY OF THE INVENTION

In order to solve the problems described above, example embodiments of the present invention provide a bonded Functionally Graded Material (FGM) structure, which has wide use in applications requiring efficient heat transfer and high CTE (coefficient of thermal expansion) matching. Example embodiments of the present invention also provide a method of manufacturing the bonded Functionally Graded Material (FGM) structure. Example embodiments of the present invention also provide a method for removing an aluminum oxide layer.

In an example embodiment, a bonded Functionally Graded Material (FGM) structure comprises a plurality of dissimilar material layers including a top dissimilar material layer, a bottom dissimilar material layer, and a plurality of intermediate dissimilar material layers arranged between the top dissimilar material layer and the bottom dissimilar material layer; wherein the plurality of dissimilar material layers are stacked on top of one another consecutively from the bottom dissimilar material layer to the top dissimilar material layer; and wherein each of the plurality of intermediate dissimilar material layers has a plurality of interlock structures each of which locks into two dissimilar material layers stacked below.

In an example embodiment, each of the plurality of intermediate dissimilar material layers has a first group of through holes and second group of through holes arranged alternately, the first group of through holes has a diameter larger than a diameter of the second group of through holes, the first group of through holes on any one dissimilar material layer is arranged corresponding to the second group of through holes on a dissimilar material layer stacked above, the second group of through holes on any one dissimilar material layer is arranged corresponding to the first group of through holes on a dissimilar material layer stacked below, thus, a plurality of interlock structures on any one dissimilar material layer passes through a second group of through holes on a dissimilar material layer stacked right below and lock into a first group of through holes on a dissimilar material layer further below.

In another example embodiment, the top dissimilar material layer is made of aluminum or aluminum alloys and the plurality of intermediate dissimilar material layers and the bottom dissimilar material layer are made of copper or copper alloys.

In another example embodiment, a heat transfer component is provided, which include a bonded Functionally Graded Material (FGM) structure and a plurality of convection pin fins formed on an upper surface of the bonded Functionally Graded Material (FGM) structure.

Another example embodiment provides a method for producing a bonded Functionally Graded Material (FGM) structure, including the steps of providing a plurality of dissimilar material layers including a top dissimilar material layer and a bottom dissimilar material layer and a plurality of intermediate dissimilar material layers; forming a first group of through holes and a second group of through holes arranged alternately on the plurality of intermediate dissimilar material layers and forming a first group of blind holes and second group of blind holes arranged alternately on the bottom dissimilar material layer, wherein the first group of through holes has a diameter larger than a diameter of the second group of through holes; cleaning surfaces of the plurality of dissimilar material layers; stacking the plurality of dissimilar material layers on top of one another consecutively from a bottom dissimilar material layer to a top dissimilar material layer, wherein a first group of through holes on any dissimilar material layer is arranged corresponding to a second group of through holes on a dissimilar material layer stacked above, and a second group of through holes on any dissimilar material layer is arranged corresponding to a first group of through holes on a dissimilar material stacked right below; and bonding the plurality of dissimilar material layers using a diffusion bonding process.

Accordingly, example embodiments of the present invention provide the following advantages: during the bonding process, surfaces of the dissimilar material layers remain oxide-free; a plurality of mechanical interlock structures are used to attach the dissimilar material layers together so that the bonded dissimilar material layers can bear large differences in thermal expansion between each of the dissimilar material layers; the bonded dissimilar material structure has high electrical conductivity and high thermal conductivity.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE EXAMPLE EMBODIMENTS OF THE PRESENT INVENTION

Figure 1A:
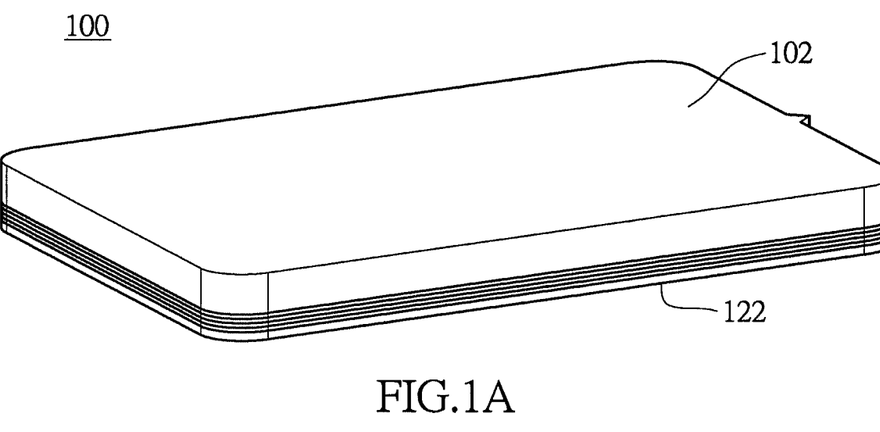
FIG. 1A is a perspective view of a Functionally Graded Material (FGM) plate 100 according to an example embodiment of the present invention.
Figure 1B:
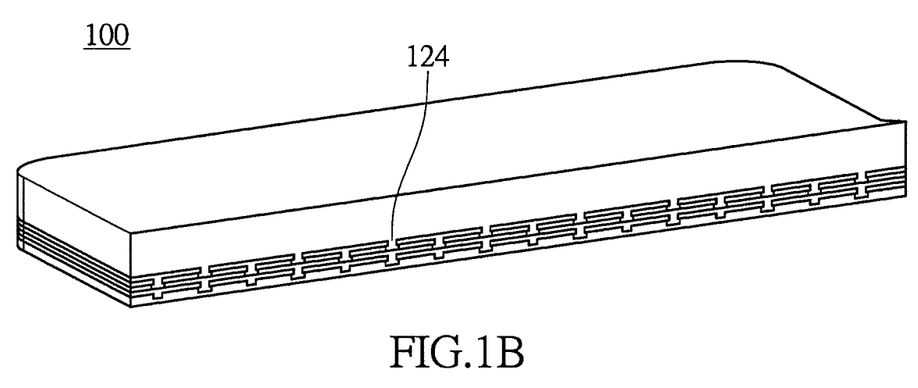
FIG. 1B is a cross-sectional view of a Functionally Graded Material (FGM) plate 100 according to an example embodiment of the present invention illustrated in FIG. 1A.

FIG. 1A is a cross-sectional view of a Functionally Graded Material (FGM) plate 100 according to an example embodiment of the present invention. FIG. 1B is a cross-sectional view of a Functionally Graded Material (FGM)

plate 100 according to an example embodiment of the present invention. The FGM layer 102 is an aluminum alloy and a plurality of dissimilar metal layers 122 are bonded to FGM layer 102. The dissimilar metal layers 122 include a plurality of dissimilar metal layers bonded together using a diffusion bonding process and a plurality of mechanical interlocks 124.

Figure 2:
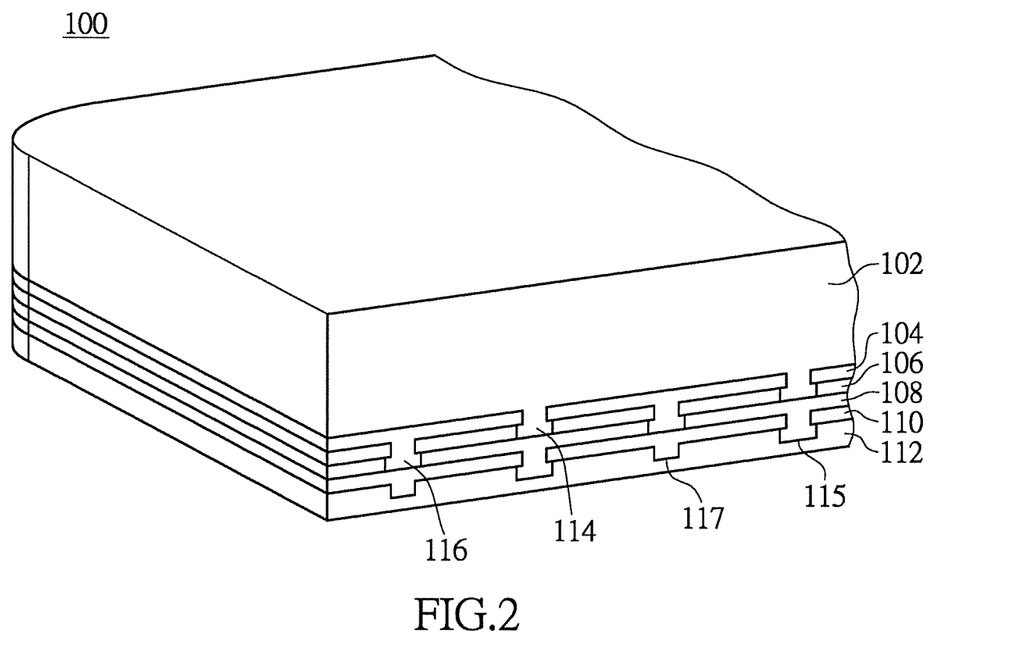
FIG. 2 is a detailed sectional view of a portion of the FGM plate 100.

Referring now to FIG. 2, a detailed sectional view of a portion of the FGM plate 100 is shown. The FGM plate 100 includes a plurality of FGM layers stacked on top of one another consecutively. The first FGM layer 102 may be manufactured of a malleable conductive metal such as an aluminum alloy. The second FGM layer 104 is a dissimilar malleable metal such as copper having a lower CTE than FGM layer 102 and a higher yield strength than FGM layer 102 at bonding temperature. The third FGM layer 106 is a dissimilar malleable metal such as a metal alloy consisting of an 80% copper and 20% molybdenum alloy and having a lower CTE than the second FGM layer 104 and a higher yield strength than the second FGM layer 104 at bonding temperature. The fourth FGM layer 108 is a dissimilar malleable metal such as a metal alloy consisting of a 60% and copper 40% molybdenum alloy and having a lower CTE than the third FGM layer 106 and a higher yield strength than the third FGM layer 106 at bonding temperature. The fifth FGM layer 110 is a dissimilar malleable metal such as a metal alloy consisting of a 40% copper and 60% molybdenum alloy and having a lower C than the fourth FGM layer 110 and a higher yield strength than the fourth FGM layer 110 at bonding temperature. The sixth FGM layer, 112 is a dissimilar malleable metal such as a metal alloy consisting of a 20% copper and 80% molybdenum alloy and having a lower CTE than the fifth FGM layer 110 and a higher yield strength than the fifth FGM layer 110 at bonding temperature. The first FGM layer 102 has a plurality of mechanical interlocks 114 that lock into the third FGM layer 106. The second FGM layer 104 has a plurality of mechanical interlocks 116 that lock into the fourth FGM layer 108. The third FGM layer 106 has mechanical interlock that lock into the fifth FGM layer 110 but are not shown in this sectional view. The fourth FGM layer 108 has a plurality of mechanical interlocks 115 that lock into the sixth FGM layer 112. The fifth FGM layer 110 has a plurality of mechanical pins 117 that lock into the sixth FGM layer 112.

Figure 3:
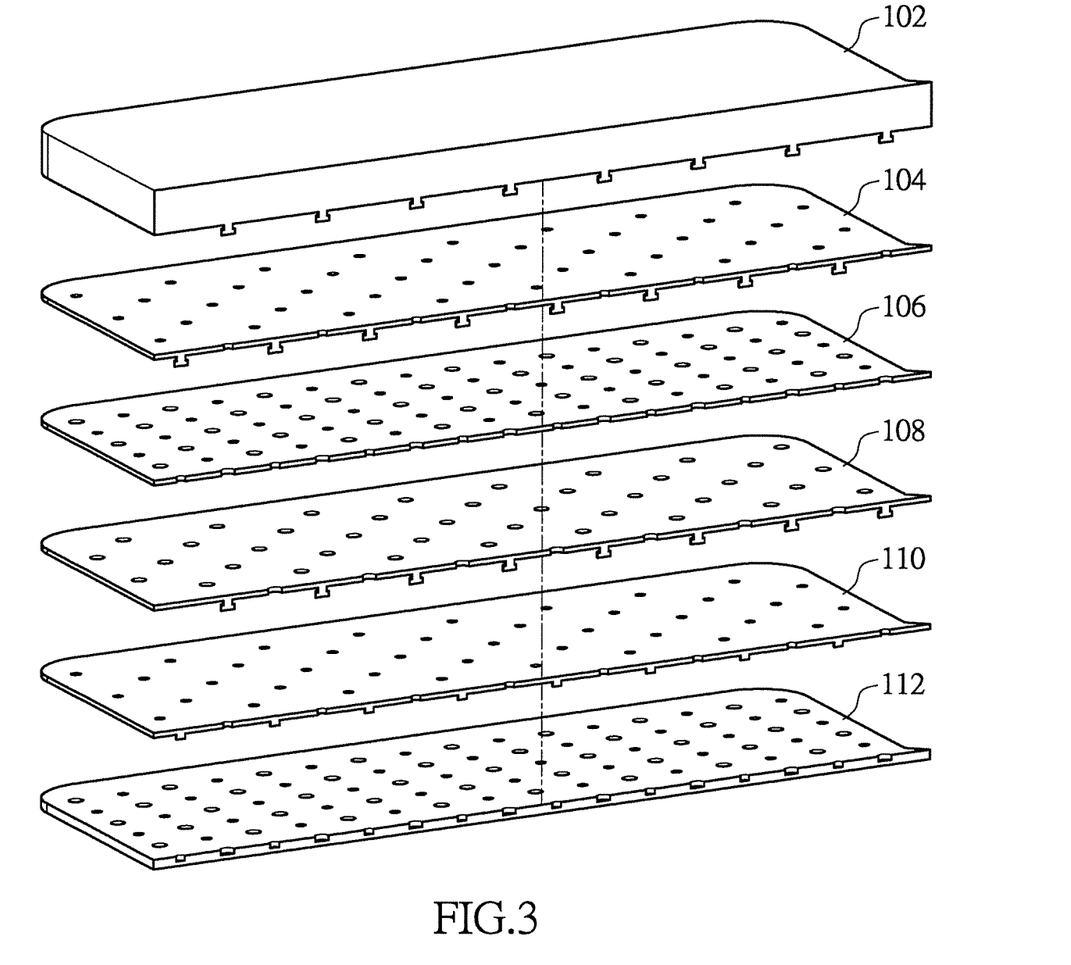
FIG. 3 is an exploded view of the FGM plate 100.
Figure 4:
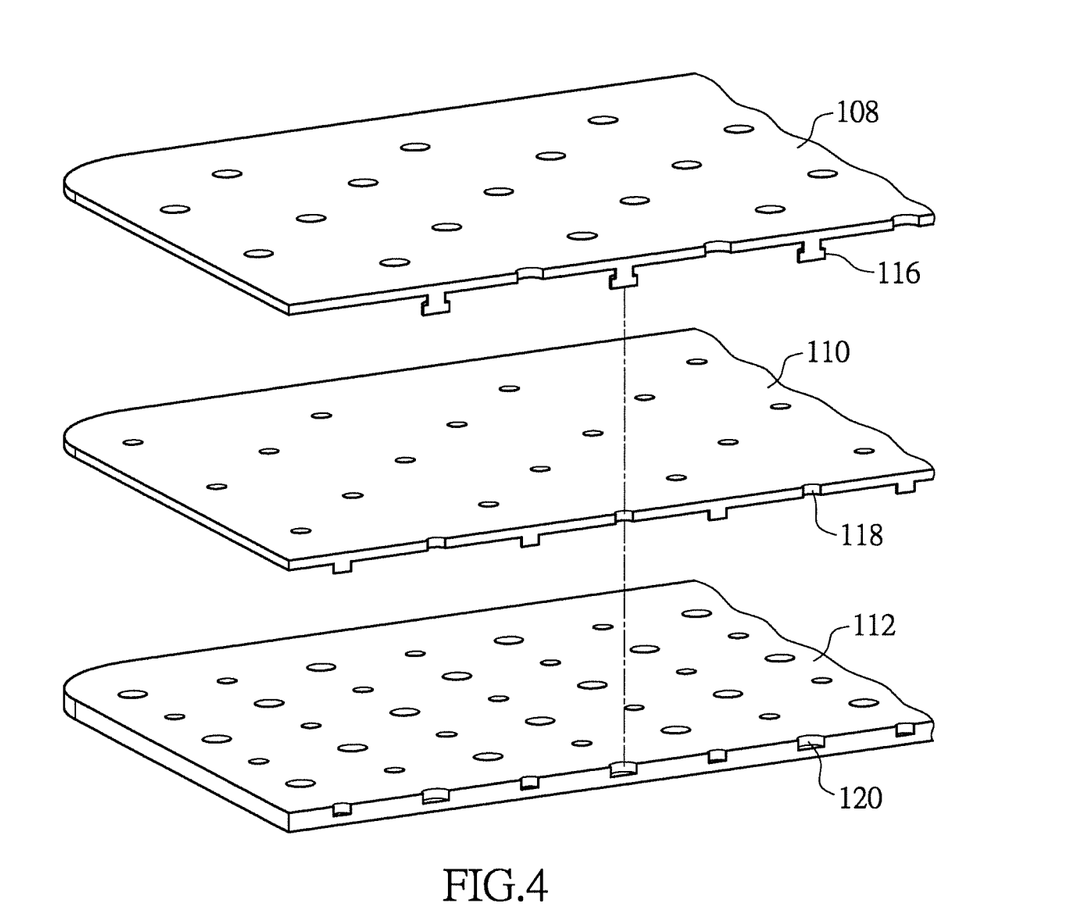
FIG. 4 is an exploded view of a portion of the FGM plate 100.

Referring to FIGS. 3 and 4, which are exploded views of the FGM plate 100, the FGM layers 104, 106, 108, and 110 each have a plurality of through holes. The sixth FGM layer 112 has a plurality of blind holes. The plurality of blind holes on the sixth FGM layer 112 further includes a first group of blind holes and a second group of blind holes arranged alternately. The first group of blind holes has a diameter larger than the diameter of the second group of blind holes. The plurality of through holes on each of the FGM layers 106, 108 and 110 further includes a first group of through holes and a second group of through holes arranged alternately. The first group of through holes has a diameter larger than the diameter of the second group of through holes. The first group of through holes on the third FGM layer 106 are arranged corresponding to the plurality of through holes on the second FGM layer 104, and the second group of through holes on the third FGM layer 106 are arranged corresponding to the first group of through holes on the fourth FGM layer 108. Further, the second group of through holes on the third FGM layer 106 is covered by the second FGM layer 104. The second group of through holes on the fourth FGM layer 108 are arranged corresponding to the first group of through holes on the fifth FGM layer 110 and are covered by the third FGM layer 106. The second group of through holes on the fifth FGM layer 110 are arranged corresponding to the first group of blind holes on the sixth FGM layer 112 and are covered by the fourth FGM layer 108. The second group of blind holes on the sixth FGM layer 112 is covered by the fifth FGM layer 110.

In an example embodiment according to the present invention, there may be more FGM layers arranged between the top FGM layer and the bottom FGM layer. In this example embodiment, except for the FGM layer adjacent to the top FGM layer, all other FGM layers arranged between the top FGM layer and the bottom FGM layer each may have a structure similar to the structure of the FGM layer 106, 108 or 110.

Referring now to FIG. 2, FGM plate 100 is placed inside a mechanical force or isostatic pressure diffusion bonding apparatus for processing. FGM plate 100 may be processed individually or in stacks.

The following is a description of a process for making bonded materials according to example embodiments of the present invention. First, a cleaning process is performed on all materials, namely, the FGM layers. In general, there are three methods used to remove aluminum oxide: mechanical, chemical, and plasma. There are also combinations of these three methods. Chemical methods to remove aluminum oxide use acid (nitric acid, HNO3) or alkaline (sodium hydroxide, NaOH) solutions. An example of a known acid cleaning process is to immerse an aluminum part in a 50% nitric acid aqueous solution at the room temperature for 15 minutes. The part is then rinsed in cold water, then rinsed in hot water, and then dried. Acid and alkaline cleaning processes can be combined. A known combination cleaning process is to immerse an aluminum part in a 5% NaOH solution and heat the aluminum part to 70° C. for one minute. Then, rinse the aluminum part in cold water, and then immerse the aluminum part in a 50% nitric acid aqueous solution at the room temperature for about 30 seconds, followed by a cold water rinse and then a hot water rinse, and then dry the aluminum part. After the aluminum oxide layer is removed, the aluminum component must be processed quickly because a new oxide layer begins to form as soon as the cleaning process ends.

An etching process taught in related U.S. provisional patent application Ser. No. 62/097,030, filed 2014 Dec. 27 by the inventor of the present invention works well. The metal parts are sealed in a chamber or in a can and immersed in an etching solution for about 15 seconds. The etchant consists of 75%-85% phosphoric acid ($H_3PO_4$), 0%~10% acetic acid ($CH_3COOH$), 0%~10% nitric acid ($HNO_3$), and 5%~15% water ($H_2O$). The etching solution should be at approximately room temperature. After the metal parts are immersed for 15 seconds, the etchant should be drained using a vacuum. The vacuum should be maintained until all of the etchant has evaporated and the pressure inside the chamber is about $1 \times 10^{-2}$ Pa or lower. By following the time temperature and etchant recommendations, about 0.05 µm of material will be removed from the aluminum surfaces of the first FGM layer 102. The vacuum action will cause the etchant to boil, and this agitation will displace the aluminum oxide particles. The vacuum, while removing the boiling etchant, will also prevent aluminum plate 102 from further etching. This process will leave the faying surfaces of the FGM layers smooth with no oxides.

At this point, if the plates are etched in a diffusion bonding chamber, they should now be placed in the chamber under a vacuum. If the plates are processed in vacuum cans, load the cans into an isostatic pressure diffusion bonding apparatus. In either case, the diffusion bonding apparatus needs to be first heated to about 550° C.

Referring again to FIG. 2, after the temperature of the metal plates has stabilized, a mechanical force or an isostatic pressure of about 110 MPa (15 kpsi) is applied to the plates. An aluminum plate of A6063-T6 will have a yield strength of only about 3 MPa at 550° C., which is at 90% of solidus temperature. Copper is much stronger at this temperature, which is only at 51% of its melting temperature. Pressure is distributed within FGM plates from 102 through 112. Because the metal parts are in a vacuum environment, FGM plate 102 is extruded through the through-holes of FGM plate 104 and lock into the first group of through holes on the FGM plate 106. The FGM plate 104 is extruded through the second group of through holes on the FGM plate 106 and lock into the first group of through holes on the FGM plate 108. The FGM plate 106 is extruded through the second group of through holes on the FGM plate 108 and lock into the first group of through holes on the FGM plate 110. The FGM plate 108 is extruded through the first group of through holes on the FGM plate 110 and lock into the first group of blind holes on the FGM plate 112. The FGM plate 110 is extruded through the second group of blind holes on the FGM plate 112 and lock into the second of blind holes on the FGM plate 112. Thus, a plurality of interlocks 114, 115, 116 and 117 are formed.

In an example embodiment according to the present invention, more FGM layers are arranged between the top FGM layer and the bottom FGM layer. In this example embodiment, except for the FGM layer adjacent to the top FGM layer, all other FGM layers arranged between the top FGM layer and the bottom FGM layer each have a structure similar to the structure of the FGM layer 106, 108 or 110. In this example embodiment, any FGM layer may be extruded through a second group of through holes on the FGM layer stacked right below and lock into a first group of through holes on the FGM layer stacked next.

In one embodiment FGM layer 102 has a CTE of about $23 \times 10^{-6}$. FGM layer 104 has a CTE of about $17 \times 10^{-6}$. FGM layer 106 has a CTE of about $15 \times 10^{-6}$. FGM layer 108 has a CTE of about $13 \times 10^{-6}$. FGM layer 110 has a CTE of about $10 \times 10^{-6}$ and FGM layer 112 has a CTE of about $8 \times 10^{-6}$, which matches the C for most DBC semiconductor layers and thus provides a reliable bond. The combination of high isostatic pressure and high temperature causes the faying surfaces of the FGM layers to be bonded after a period of about 2 hours. The exact values of the temperature, time, and pressure variables are determined by experiments and modeling of the plate materials. After the bonding process ends, the heater can be deactivated and the chamber can be vented to the atmosphere. When the plate weldments cool they may be removed from the chamber.

Figure 5A:
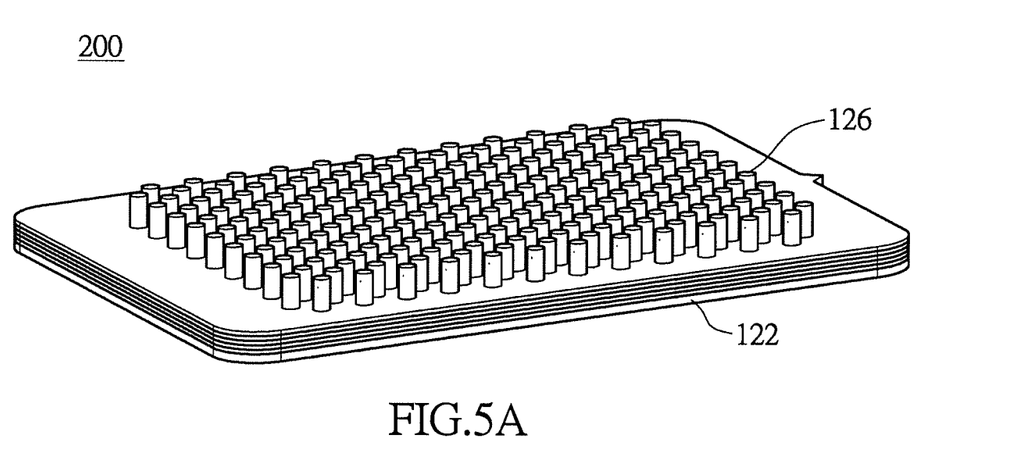
FIG. 5A shows a perspective view of a finished heat sink 200 according to another example embodiment of the present invention.
Figure 5B:
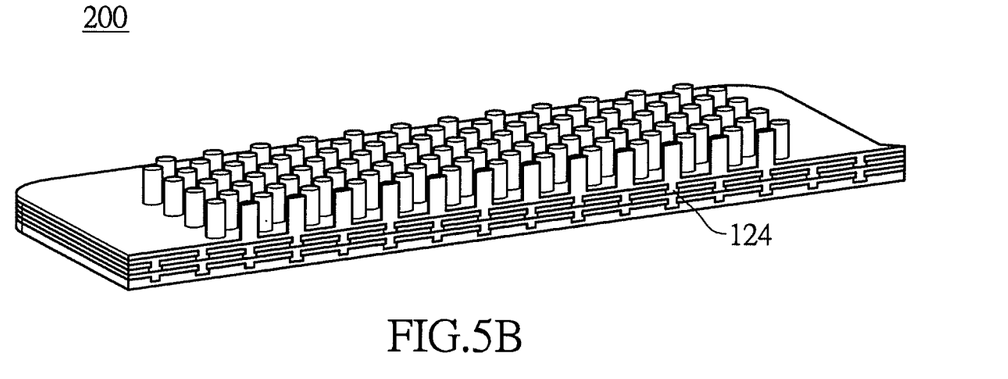
FIG. 5B is a cross-sectional view of the finished heat sink 200.

FIG. 5A shows a perspective view of a finished heat sink 200 according to another example embodiment of the present invention and FIG. 5B is a cross-sectional view of the finished heat sink 200. The heat sink 200 has a plurality of convection pin fins 126 formed on the upper surface of the first FGM layer 102.

While the present invention has shown and described with reference to exemplary embodiments thereof, it will be understood by those of ordinary skill in the art that various changes in form and details may be made therein without departing from the spirit and scope of the present invention as defined by the following claims.

What is claimed is:

1. A method for producing a bonded Functionally Graded Material (FGM) structure, comprising:
   providing a plurality of dissimilar material layers including a top dissimilar material layer and a bottom dissimilar material layer and a plurality of intermediate dissimilar material layers;
   forming a first group of through holes and a second group of through holes arranged alternately on the plurality of intermediate dissimilar material layers and forming a first group of blind holes and second group of blind holes arranged alternately on the bottom dissimilar material layer, wherein the first group of through holes has a diameter larger than a diameter of the second group of through holes;
   cleaning surfaces of the plurality of dissimilar material layers;
   stacking the plurality of dissimilar material layers on top of one another consecutively from a bottom dissimilar material layer to a top dissimilar material layer, wherein a first group of through holes on any dissimilar material layer is arranged corresponding to a second group of through holes on a dissimilar material layer stacked above, and a second group of through holes on any dissimilar material layer is arranged corresponding to a first group of through holes on a dissimilar material stacked right below; and
   bonding the plurality of dissimilar material layers using a bonding process.

2. The method for producing a bonded Functionally Graded Material (FGM) structure according to claim 1, wherein cleaning surfaces of the plurality of dissimilar material layers includes using acid or alkaline solutions to remove oxide material from the dissimilar material layers.

3. The method for producing a bonded Functionally Graded Material (FGM) structure according to claim 1, wherein cleaning surfaces of the plurality of dissimilar material layers includes using etchant consisting of 75%-80% phosphoric acid (H3PO4), 0%-10% acetic acid (CH3COOH), 0%-10% nitric acid (HNO3), and 5%-15% water (H2O) to remove oxide material from the dissimilar material layers.

4. The method for producing a bonded Functionally Graded Material (FGM) structure according to claim 1, wherein bonding the plurality of dissimilar material layers using a bonding process includes the following steps:
   disposing the stacked plurality of dissimilar material layers in a bonding apparatus; and
   applying a mechanical force or an isostatic pressure to the dissimilar material layers, the pressure is distributed within the dissimilar material layers, every dissimilar material layer of the plurality of intermediate dissimilar material layers is extruded through the second group of through holes on a dissimilar material layer stacked right below and lock into the first group of through holes on an adjacent dissimilar material layer, and thus form a plurality of interlock structures in the plurality of dissimilar material layers.

* * * * *